US012713602B2

(12) United States Patent
Ariga et al.

(10) Patent No.: US 12,713,602 B2

(45) Date of Patent: Aug. 18, 2026

(54) SEMICONDUCTOR DEVICE WITH REDUCED ELECTRIC RESISTANCE DIFFERENCE

(71) Applicant: Kioxia Corporation, Tokyo (JP)

(72) Inventors: Tomotaka Ariga, Yokkaichi Mie (JP); Masayuki Kitamura, Yokkaichi Mie (JP); Hiroshi Toyoda, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 578 days.

(21) Appl. No.: 18/172,549

(22) Filed: Feb. 22, 2023

(65) Prior Publication Data

US 2023/0422500 A1 Dec. 28, 2023

(30) Foreign Application Priority Data

Jun. 23, 2022 (JP) ................................ 2022-100802

(51) Int. Cl.
*H10B 43/27* (2023.01)

(52) U.S. Cl.
CPC .................................... *H10B 43/27* (2023.02)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 9,673,213 | B1 * | 6/2017 | Yu .......................... | H10B 43/40 |
| 2015/0041873 | A1 * | 2/2015 | Karda .................... | H10B 51/20 257/295 |
| 2018/0261624 | A1 * | 9/2018 | Ishikura ............. | H10D 30/0413 |
| 2021/0066468 | A1 | 3/2021 | Beppu et al. | |
| 2021/0305275 | A1 | 9/2021 | Natori et al. | |
| 2022/0076965 | A1 | 3/2022 | Matsuda et al. | |
| 2022/0085053 | A1 | 3/2022 | Kitamura et al. | |
| 2022/0085066 | A1 | 3/2022 | Natori et al. | |

FOREIGN PATENT DOCUMENTS

| | | |
|---|---|---|
| JP | 2003-218229 A | 7/2003 |
| WO | WO-2018/131170 A1 | 7/2018 |

* cited by examiner

*Primary Examiner* — William B Partridge
*Assistant Examiner* — Gustavo G Ramallo
(74) *Attorney, Agent, or Firm* — Foley & Lardner LLP

(57) ABSTRACT

A semiconductor device includes a plurality of insulating layers, a plurality of conductive layers that are formed alternately with the plurality of insulating layers, an interlayer film, and a channel. The interlayer film is different from the conductive layer, has a crystal structure of a hexagonal crystal system, and is formed between at least one of the insulating layers and at least one of the conductive layers. The channel penetrates through the plurality of conductive layers, the interlayer film, and the plurality of insulating layers.

20 Claims, 11 Drawing Sheets

SEMICONDUCTOR DEVICE WITH REDUCED ELECTRIC RESISTANCE DIFFERENCE

CROSS-REFERENCE TO RELATED APPLICATION(S)

This application is based upon and claims the benefit of priority from Japanese Patent Application No. 2022-100802, filed Jun. 23, 2022, the entire contents of which are incorporated herein by reference.

FIELD

Embodiments described herein relate generally to a semiconductor device and a method for manufacturing the semiconductor device.

BACKGROUND

Known semiconductor devices include semiconductor packages using NAND flash memory chips. Among such NAND flash memory chips, three-dimensional memory devices including a plurality of conductive layers (word lines) that are stacked on a substrate have been developed.

DETAILED DESCRIPTION

Figure 1:
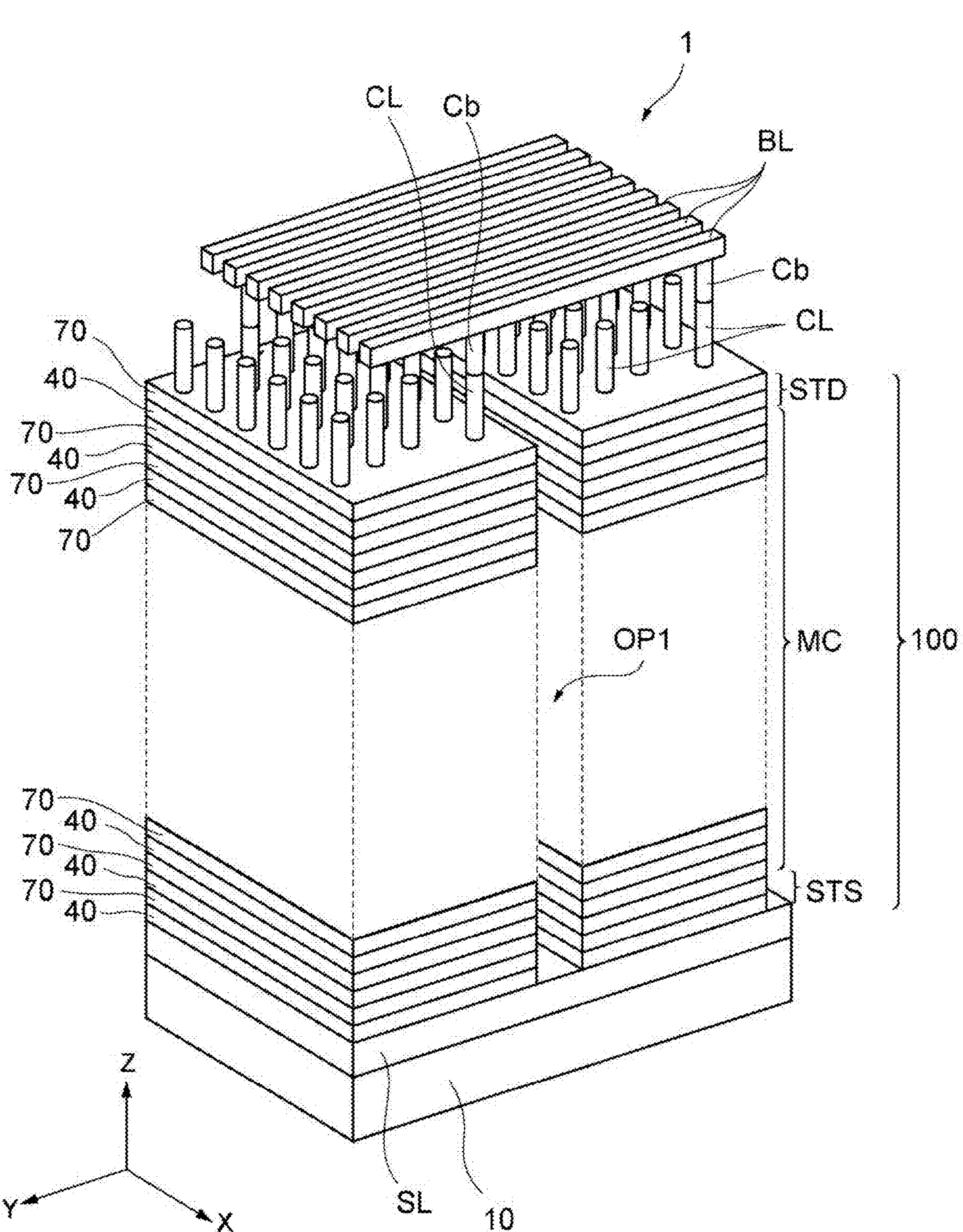
FIG. 1 is a perspective view illustrating the whole structure of a semiconductor device according to at least one embodiment of the present disclosure.

Embodiments provide a semiconductor device in which a difference in electric resistance is reduced and also provide a method for manufacturing the same.

In general, according to at least one embodiment, a semiconductor device includes a plurality of insulating layers, a plurality of conductive layers that are formed alternately with the plurality of insulating layers, an interlayer film, and a channel. The interlayer film is different from the conductive layer, has a crystal structure of a hexagonal crystal system, and is formed between at least one of the insulating layers and at least one of the conductive layers. The channel penetrates through the plurality of conductive layers, the interlayer film, and the plurality of insulating layers.

Hereinafter, embodiments according to an example of the disclosure will be described with reference to the drawings. It is noted that the embodiments described below are merely illustrations and are not intended to exclude various modifications and alterations and application of techniques that are not explicitly described below. That is, an example of the disclosure may be implemented by variously modifying and altering it within the scope not departing from the gist of the disclosure. The drawings are explained hereinafter by adding the same or similar reference signs to the same or similar components. The drawings are schematic illustrations and do not necessarily show actual dimensions, ratios, and so on. Moreover, the drawings may include components in which dimensional relationships and ratios are different from each other. The embodiment, etc., described below are embodiments and so on of a part of the disclosure and do not represent all embodiments of the disclosure. Any other embodiments and the like that can be obtained based on the embodiments, etc., of the disclosure, without the need for a person skilled in the art to perform creative practices, are included in the scope of protection of the disclosure.

In the disclosure, functions of a "layer", a "film", a "part", a "device (which is a concept interchangeably referred to as an "apparatus", a "unit", a "means", a "mechanism", a "system", or the like; the same applies to those described below)", and a constituent part or element thereof, may be implemented by two or more physical means or devices, or the like, or functions of two or more thereof may be implemented by one physical means or device, or the like. The same applies to a "process" and a "step". The embodiments and examples are described below by using a memory cell array as an example of a "semiconductor device", but the technique of the disclosure can be employed in appropriate semiconductor devices other than memory cell arrays (e.g., CPUs, displays, and interposers).

In the embodiments and examples described below, a direction from a substrate to a memory cell is referred to as "upper", "upward", or "upside". Conversely, a direction from a memory cell to a substrate is referred to as "lower", "downward", or "downside". In this manner, for convenience of explanation, words "upper", "upward", or "upside", or words "lower", "downward", or "downside" may be used, and these words show relative arrangement or relative positional relationships. For example, it is also possible to arrange a substrate and a memory cell so that an upper-lower relationship thereof will be inverted from the state illustrated in the drawings, and the same applies to a right-left direction in the drawings. In the following descriptions, expressions such as "a memory cell on a substrate" merely show relative relationships of the substrate and the memory cell in an upper-lower direction, as described above, that is, other member may be disposed between the substrate and the memory cell. Moreover, expressions such as "α includes A, B, or C", "α includes (at least) one of A, B, and C", and "α includes (at least) one selected from a group of A, B, and C", do not exclude a case in which α includes a combination of two or more of A to C and a case in which α also includes another element other than A to C, unless otherwise specified.

Structural Example 1 of Memory Cell Array

Figure 2:
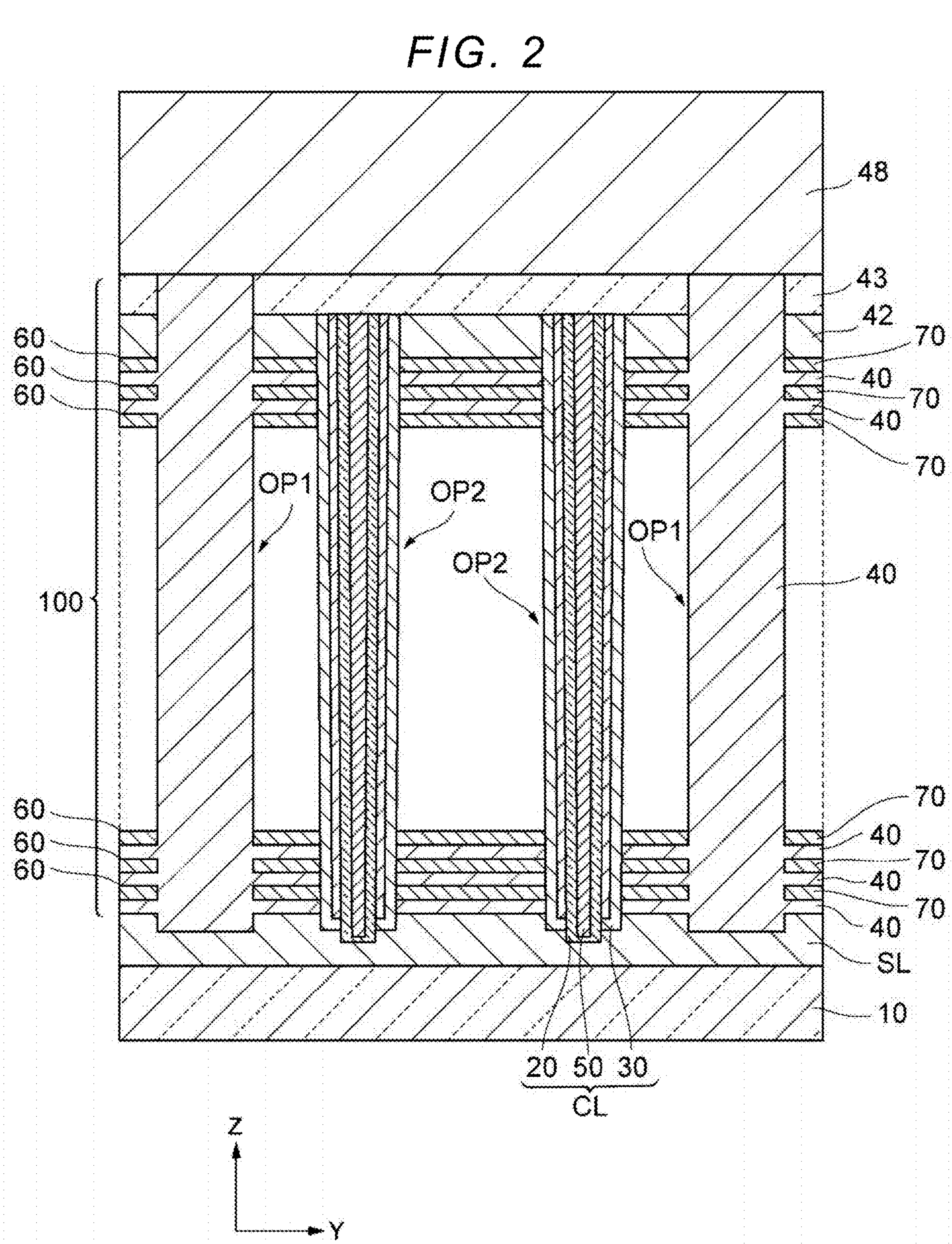
FIG. 2 is a sectional view illustrating the whole structure of the semiconductor device according to at least one embodiment of the disclosure.

FIGS. 1 and 2 are respectively a perspective view and a sectional view schematically illustrating the whole structure of a semiconductor device (memory cell array) according to at least one embodiment of the disclosure. In these drawings, two directions in parallel to a major surface of a substrate 10 and orthogonal to each other are referred to as an X direction and a Y direction, respectively. A direction orthogonal to both of the X direction and the Y direction is referred to as a Z direction (stacked direction).

A memory cell array 1 includes a substrate 10, a source layer SL provided on the substrate 10, a stacked body 100 provided on the source layer SL, a plurality of columnar parts CL, and a plurality of bit lines BL provided on the stacked body 100. The substrate 10 is, for example, a silicon (Si) substrate. The bit lines BL and the source layer SL have electrical conductivity. The plurality of bit lines BL are separated from each other in the X direction, and each bit line BL extends in the Y direction.

The stacked body 100 is formed with a plurality of mutually insulated conductive layers 70 and a plurality of openings OP1 and OP2 common to the plurality of conductive layers 70. In other words, the stacked body 100 includes a plurality of conductive layers 70 that are stacked on the substrate 10 via the source layer SL. The openings OP1 and OP2 extend in the stacked direction (Z direction) and reach the source layer SL. In more detail, the opening OP1 extends in the X direction and divides the stacked body 100 into a plurality of blocks in the Y direction. The opening OP2 is formed with a columnar part CL, which will be described later (refer to FIG. 2).

This columnar part CL is formed into a circular cylinder shape or an elliptic cylinder shape extending in the stacked direction (Z direction) in the stacked body 100, and a plurality of the columnar parts CL are arranged, for example, in a zigzag shape, or in a square lattice shape along the X direction and the Y direction, as illustrated in FIG. 1. Upper ends of semiconductor layers 20 of the plurality of columnar parts CL that are selected one by one in the respective blocks, which are separated in the Y direction by the openings OP1, are connected to the same bit line BL via contact parts Cb.

The columnar part CL is provided with a drain-side select transistor STD at an upper end part and is also provided with a source-side select transistor STS at a lower end part. For example, the lowermost conductive layer 70 functions as a control gate of the source-side select transistor STS, whereas the uppermost conductive layer 70 functions as a control gate of the drain-side select transistor STD. A plurality of memory cells MC are provided between the drain-side select transistor STD and the source-side select transistor STS. The plurality of memory cells MC, the drain-side select transistor STD, and the source-side select transistor STS are serially connected via the semiconductor layer 20 and constitute one memory string. The memory strings are arranged in a plane direction parallel to an X-Y plane, and the plurality of memory cells MC are three-dimensionally provided in the X direction, the Y direction, and the Z direction.

Herein, as illustrated in FIG. 2, an insulating layer 40 is formed in the opening OP1, and insulating layers 42, 43, and 48 are formed on the stacked body 100. However, these insulating layers are omitted in FIG. 1 for convenience of explanation. The plurality of conductive layers 70 and a plurality of the insulating layers 40 are alternately stacked in a periodic manner in a direction perpendicular to the major surface of the substrate 10 (stacked direction: Z direction). In other words, the insulating layer 40 is formed between the conductive layers 70 that are adjacent in the stacked direction (Z direction). In addition, the insulating layer 40 is also formed between the source layer SL and the lowermost conductive layer 70. The insulating layer 42 described above is provided on the uppermost conductive layer 70, and the insulating layer 43 is provided on the insulating layer 42. Moreover, an interlayer film 60 being thinner than each of the conductive layer 70 and the insulating layer 40 is formed between the conductive layer 70 and the insulating layer 40, in such a manner as to define a structure in which the conductive layers 70 and the insulating layers 40 are repeatedly stacked via the insulating layers 60. The insulating layer 40 that is formed in the opening OP1 is provided continuously with the insulating layer 40 that is formed between the conductive layers 70 adjacent in the stacked direction. Although the interlayer film 60 is illustrated at the whole area between the conductive layer 70 and the insulating layer 40 in FIG. 2, the interlayer film 60 may be formed between a part of the conductive layer 70 and a part of the insulating layer 40.

The conductive layer 70 contains, for example, a transition element, and among the transition elements, for example, at least one of tungsten (W), molybdenum (Mo), titanium (Ti), and niobium (Nb) is used as a main component. The conductive layer 70 that mainly contains such an element, is crystal-grown at the time of deposition, and its crystal has a cubic system lattice structure and tends to exhibit a three-dimensional crystal structure. The conductive layer 70 may be, for example, a single-metal body, or it may be a material containing another transition element or a typical element as a secondary component in an amount less than the amount of the main component thereof. From the point of view of reducing resistance, an element that forms a complete solid solution with the main component is preferable as the secondary component.

The insulating layer 40 is made mainly of inorganic oxide or nitride such as silicon oxide ($SiO_2$), silicon nitride (SiN), aluminum oxide ($Al_2O_3$), or aluminum nitride (AlN), or it may be a silicon oxide layer formed by a chemical vapor deposition (CVD) method using tetraethyl orthosilicate (TEOS) as raw material.

The interlayer film 60 has a two-dimensional crystal structure with hexagonal crystal-based layers. The interlayer film 60 contains, for example, transition element dichalcogenide or graphene, and among compounds of transition element dichalcogenide, for example, at least one of tungsten disulfide ($WS_2$), molybdenum disulfide ($MoS_2$), titanium disulfide ($TiS_2$), and niobium disulfide ($NbS_2$) is used as a main component. It is noted that the chalcogen contained in transition element dichalcogenide of the disclosure is of a sulfur group element, which is sulfur (S), selenium (Se), or tellurium (Te).

Figure 3:
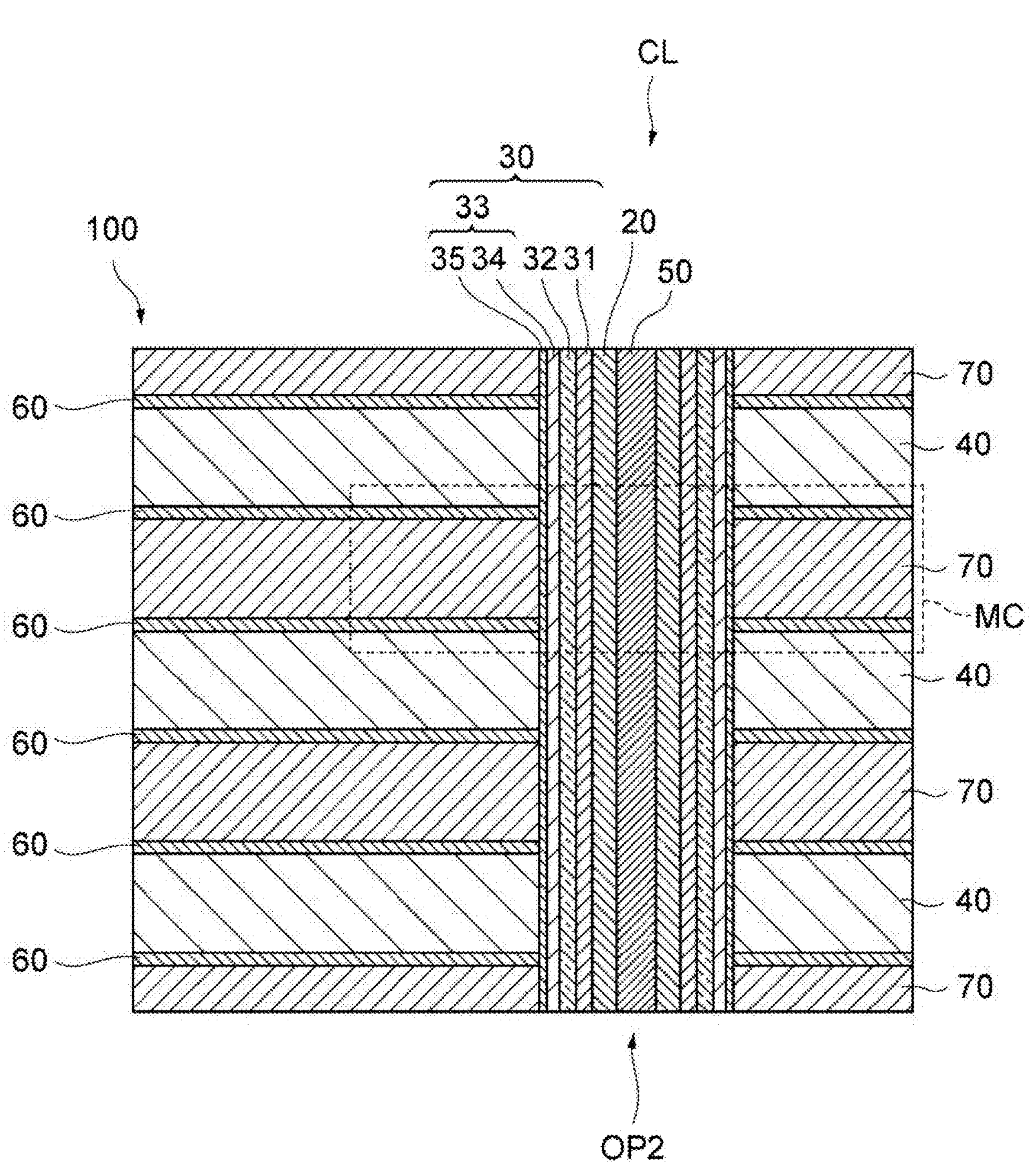
FIG. 3 is an enlarged sectional view illustrating a part of the semiconductor device according to at least one embodiment of the disclosure.

FIG. 3 is an enlarged sectional view illustrating a part in FIG. 2. As described above, the opening OP2 is formed with the columnar part CL. This columnar part CL is a structure including a semiconductor layer 20, a memory layer 30, and an insulating core layer 50, each which continuously extends in the stacked direction of the stacked body 100. The core layer 50 is provided in a columnar shape at approximately the center of the opening OP2. The semiconductor layer 20 is provided in a circular tubular shape around the core layer 50. The memory layer 30 is provided in a circular tubular shape around the semiconductor layer 20 and is in contact with a side wall (the conductive layers 70, the interlayer films 60, and the insulating layers 40 that are periodically stacked) of the opening OP2. In other words, the semiconductor layer 20 penetrates through the stacked body 100, and the memory layer 30 is provided between the conductive layer 70 and the semiconductor layer 20. The upper end of the semiconductor layer 20 is connected to the bit line BL via the contact part Cb, as illustrated in FIG. 1, whereas the lower end of the semiconductor layer 20 is connected to the source layer SL, as illustrated in FIG. 2.

The memory layer 30 includes a tunnel insulating layer 31, a charge storage layer 32, and a block insulating layer 33. The tunnel insulating layer 31, the charge storage layer 32, and the block insulating layer 33 are provided, in this order from the semiconductor layer 20 to the conductive layer 70. In other words, the tunnel insulating layer 31 is in contact with the semiconductor layer 20, the block insulating layer 33 is in contact with the conductive layer 70, and the charge storage layer 32 is provided between the tunnel insulating layer 31 and the block insulating layer 33. The semiconductor layer 20, the memory layer 30, and the conductive layer 70 constitute a memory cell MC as a nonvolatile memory having a vertical transistor structure (FIG. 3 schematically illustrates one memory cell MC by a rectangular dashed line frame).

In this memory cell MC, the semiconductor layer 20 functions as a channel, the conductive layer 70 close to the block insulating layer 33 functions as a control gate, and the charge storage layer 32 functions as a data storage layer (charge storage layer) for storing charges injected from the semiconductor layer 20. A plurality of the memory cells MC are aligned in the stacked direction of the plurality of conductive layers 70, and the plurality of conductive layers 70 also function as a word line connected to the plurality of memory cells MC.

The memory cell MC is, for example, a charge-trapping memory cell. The tunnel insulating layer 31 contains, for example, $SiO_2$, and it serves as a potential barrier at the time charges are injected from the semiconductor layer 20 into the charge storage layer 32 or at the time charges stored in the charge storage layer 32 diffuse to the semiconductor layer 20. The charge storage layer 32 contains, for example, SiN, and it includes a lot of trap sites for capturing charges in the insulating layer. The block insulating layer 33 prevents charges, which are stored in the charge storage layer 32, from diffusing to the conductive layer 70, and it prevents back tunneling of electrons from the conductive layer 70 at the time of erase operation. The block insulating layer 33 includes a first block layer 34 and a second block layer 35. The first block layer 34 is made of, for example, $SiO_2$, and it is in contact with the charge storage layer 32. The second block layer 35 is made of, for example, $Al_2O_3$ or hafnium oxide ($HfO_2$), and it is provided between the first block layer 34 and the conductive layer 70 and is in contact with the conductive layer 70.

Example of Method of Manufacturing Memory Cell Array

Next, an example of a method for manufacturing the memory cell array 1 will be described. FIGS. 4 to 7 show a process flowchart (sectional views) schematically illustrating examples of states in manufacturing the memory cell array 1 illustrated in FIG. 1.

Figure 4:
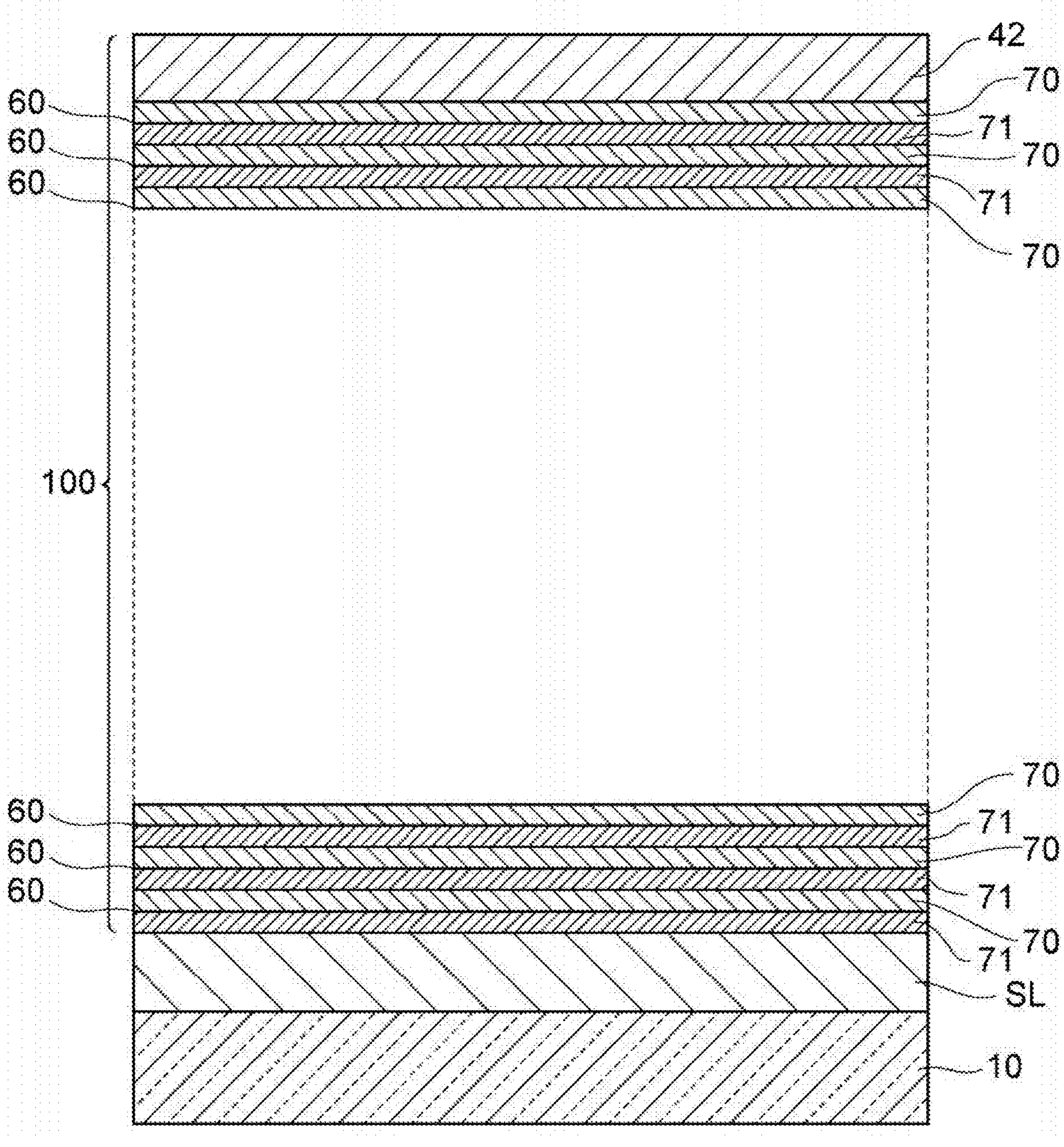
FIG. 4 is a process flowchart in an example of manufacturing the semiconductor device illustrated in FIG. 1.

As illustrated in FIG. 4, first, a source layer SL is formed on a substrate 10, and a stacked body 100 is formed on the source layer SL. The procedure of forming the stacked body 100 is as follows. That is, a sacrificial layer 71 is formed on a surface of the source layer SL, an interlayer film 60 is formed on (on one surface of) the sacrificial layer 71, and moreover, a conductive layer 70 is formed on this interlayer film 60. Subsequently, a process of stacking a sacrificial layer 71, an interlayer film 60, and a conductive layer 70, in turn, is repeatedly conducted. Thereafter, an insulating layer 42 is formed on the uppermost conductive layer 70. Thus, the uppermost conductive layer 70 is formed between a pair of the uppermost interlayer film 60 and the uppermost sacrificial layer 71, and the insulating layer 42.

Figure 5:
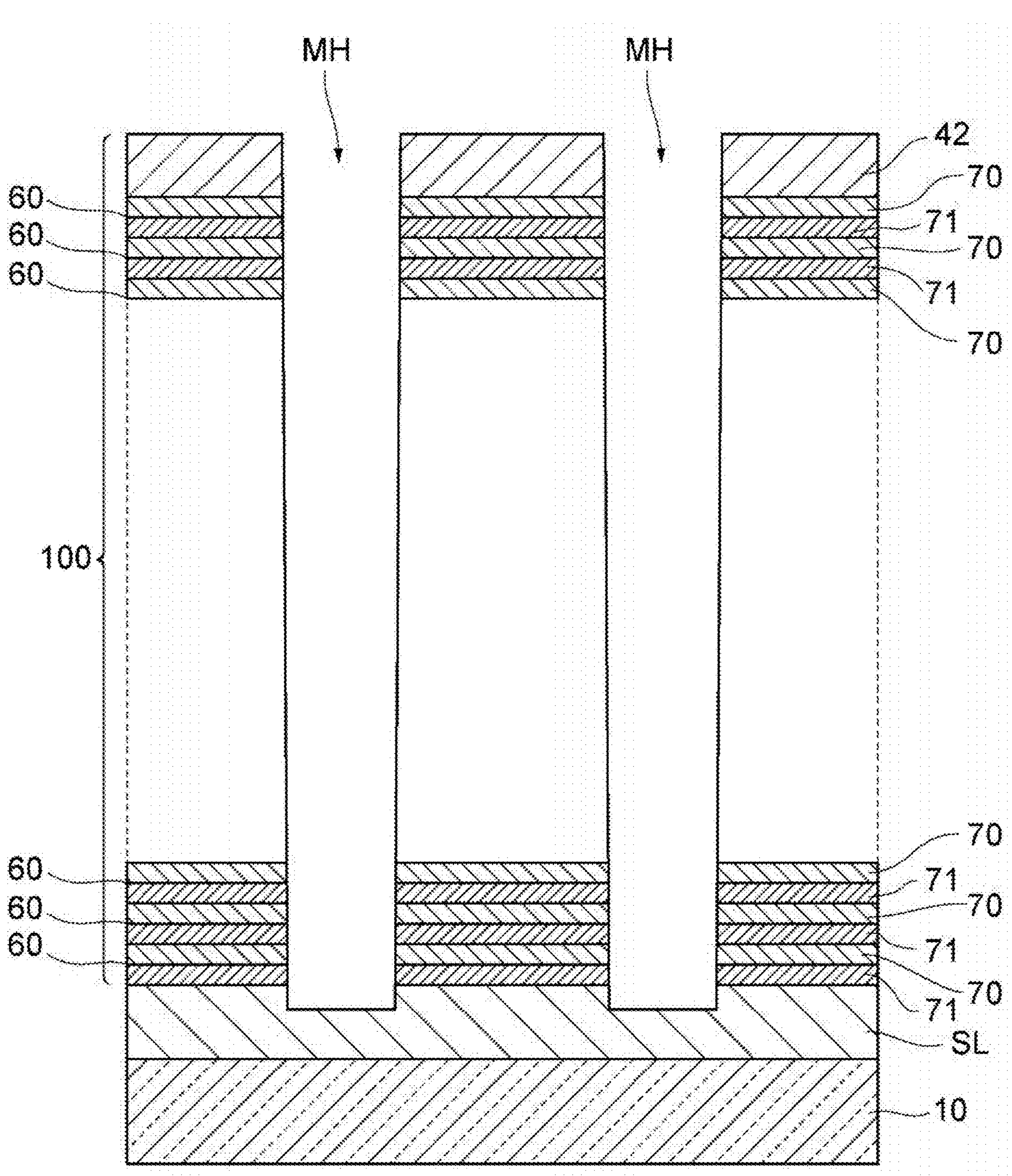
FIG. 5 is a process flowchart in the example of manufacturing the semiconductor device illustrated in FIG. 1.

Next, the structure in the state illustrated in FIG. 4 is subjected to a heat treatment, as necessary. Then, as illustrated in FIG. 5, a plurality of memory holes MH for finally generating openings OP2 are formed in the stacked body 100 that includes the plurality of conductive layers 70, the plurality of interlayer films 60, the plurality of sacrificial layers 71, and the insulating layer 42. In this manner, the memory hole MH is formed throughout the plurality of conductive layers 70, the plurality of interlayer films 60, and the plurality of sacrificial layers 71. This memory hole MH may be formed by, for example, a reactive ion etching (RIE) method using gas containing chlorine (Cl), while using an appropriate mask (not illustrated in the drawing). Thus, the plurality of conductive layers 70, the plurality of interlayer films 60, and the plurality of sacrificial layers 71 are etched all together. In this case, these layers use materials in which differences in etching rate of the RIE method are small, that is, materials that react with gas used in RIE to generate compounds having approximately equal melting points.

Figure 6:
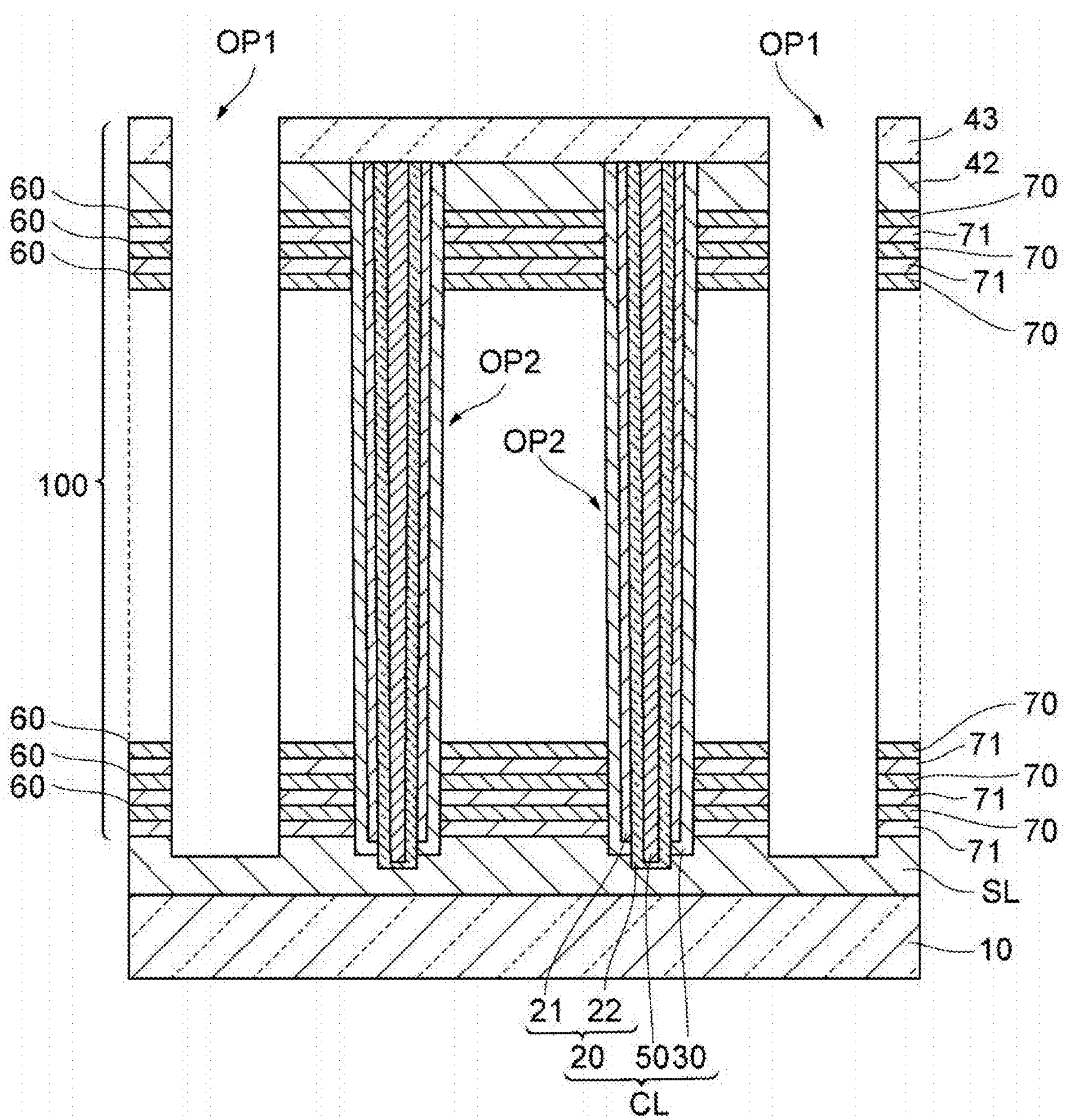
FIG. 6 is a process flowchart in the example of manufacturing the semiconductor device illustrated in FIG. 1.

Thereafter, as illustrated in FIG. 6, a memory layer 30, a semiconductor layer 20, and a core layer 50 are deposited in the memory hole MH by an appropriate method, whereby a columnar part CL including a plurality of memory cells MC, which are aligned in the stacked direction of the conductive layers 70, the interlayer films 60, and the sacrificial layers 71. The semiconductor layer 20 can include a cover layer 21 and a semiconductor layer 22. The cover layer 21 and the semiconductor layer 22 may be formed as, for example, amorphous silicon (α-Si) layers, and may then be crystalized into polycrystalline silicon layers by a heat treatment. Then, an insulating layer 43 is formed on the insulating layer 42 so as to cover an upper end of the stacked structure including the columnar parts CL. Moreover, as illustrated in the same drawing, a plurality of openings OP1 are formed in the stacked body 100 that includes the insulating layer 43, the insulating layer 42, the plurality of conductive layers 70, the plurality of interlayer films 60, and the plurality of sacrificial layers 71, by an RIE method using an appropriate mask (not illustrated in the drawing). In this manner, the opening OP1 is formed throughout the plurality of conductive layers 70, the plurality of interlayer films 60, and the plurality of sacrificial layers 71. The opening OP1 penetrates through the stacked body 100, in the vicinity of the columnar part CL, and it reaches the source layer SL.

Figure 7:
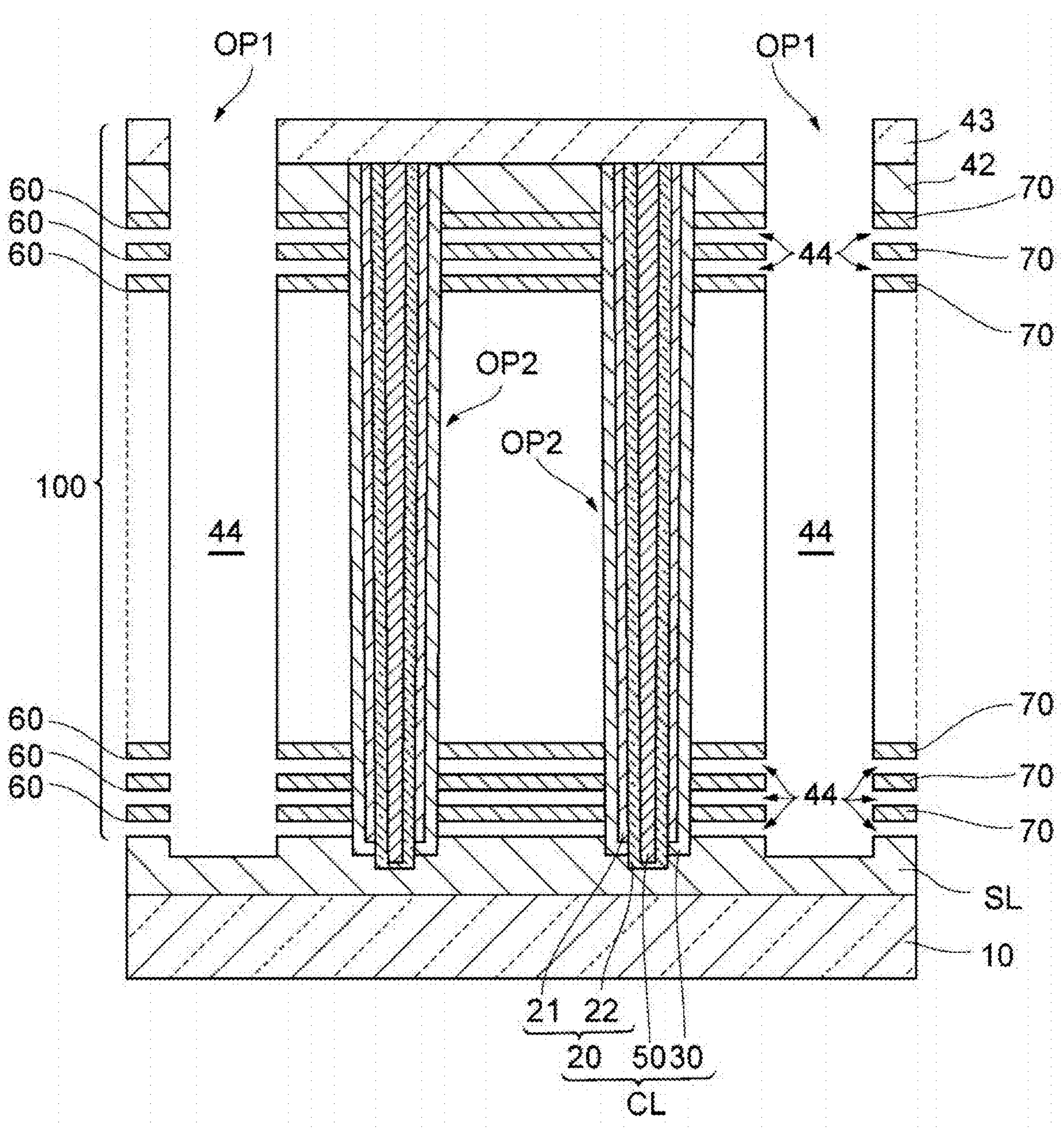
FIG. 7 is a process flowchart in the example of manufacturing the semiconductor device illustrated in FIG. 1.

Next, an etchant (etching liquid or etching gas) is supplied through the opening OP1 to remove the sacrificial layers 71, as illustrated in FIG. 7. As a result, a cavity 44 that communicates with the opening OP1 is formed in the stacked structure between the conductive layer 70 and the interlayer film 60 adjacent in the stacked direction. In view of this, the sacrificial layer 71 preferably uses a material having a high etching selectivity (high ratio of etching selectivity) with respect to the conductive layer 70. The sacrificial layer 71 contains, for example, metal such as Mo or W. From another point of view, an etchant for removing the sacrificial layer 71 may be a chemical having a high etching selectivity for the sacrificial layer 71 with respect to the conductive layer 70, the interlayer film 60, the insulating layers 42 and 43, and the second block layer 35 (refer to FIG.

3) of the memory layer 30. This prevents the conductive layer 70, the interlayer film 60, and the columnar part CL from being etched.

Then, as illustrated in FIG. 2, an insulating layer 40 containing $SiO_2$ is formed in the cavity 44, which is defined by removal of the sacrificial layer 71, by using, for example, a CVD method using TEOS as raw material gas. Specifically, the raw material gas is made to enter the cavity 44 via the opening OP1, whereby the insulating layer 40 is deposited in the cavity 44 and the opening OP1. Thereafter, an insulating layer 48 is also formed on the stacked body 100 in which the insulating layer 40 is formed, and the memory cell array 1 is obtained. Such a structure of the memory cell array 1 reduces wiring capacitance between the conductive layers 70, which also function as control gates of memory cells MC formed in the channel, as well as reduces variations (interference) in parasitic capacitance between the conductive layers 70, resulting in contribution to high speed operation of the memory cells MC.

Comparative Example

Figure 11A:
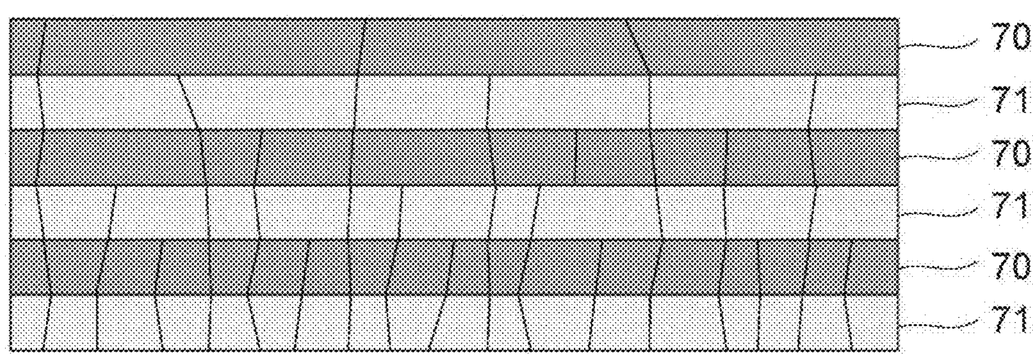
FIGS. 11A to 11C illustrate a process flowchart in an example (comparative example) of manufacturing a semiconductor device.
Figure 11B:
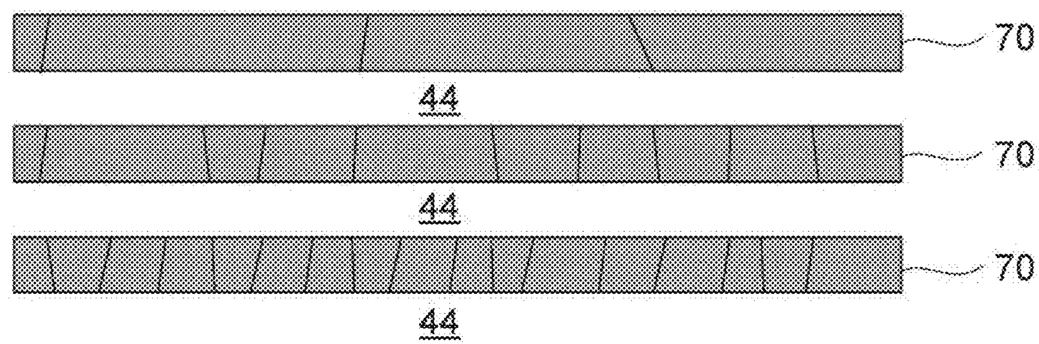
Figure 11C:
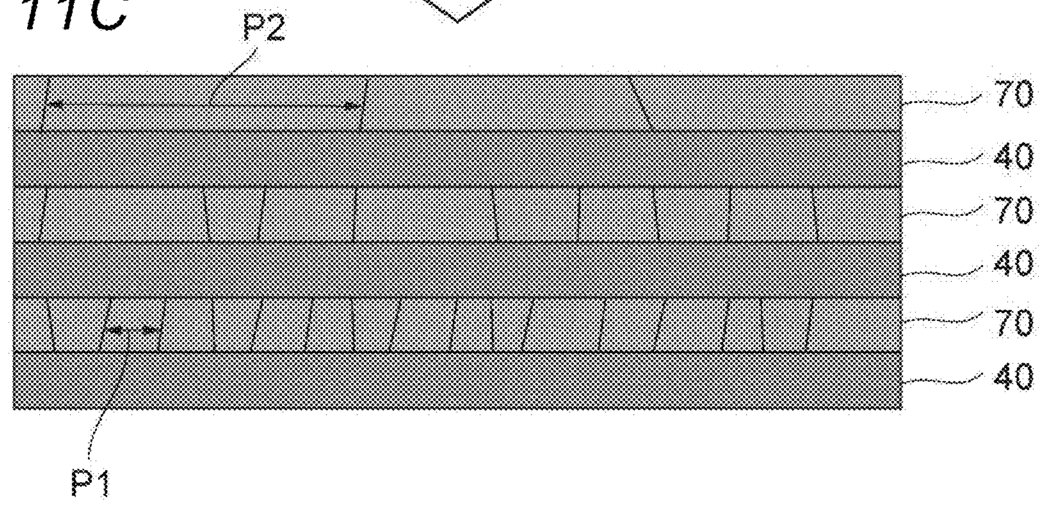

FIGS. 11A to 11C show a process flowchart (sectional views) schematically illustrating states in some steps in manufacturing the stacked body 100 of the memory cell array 1 by a method different from the method of the disclosure. FIG. 11A illustrates a state of repeating alternate (periodic) stacking of the sacrificial layer 71 and the conductive layer 70 from a lower layer to an upper layer. The material of the conductive layer 70 is transition metal such as W, Mo, Ti, or Nb, as described above, and the same applies to the sacrificial layer 71. The sacrificial layer 71 and the conductive layer 70 may be deposited by a physical vapor deposition (PVD) method, such as sputtering or vacuum evaporation, or a CVD method.

FIG. 11B illustrates a state of removing the sacrificial layers 71 by an appropriate etchant, from the stacked body illustrated in FIG. 11A. As described above, the sacrificial layer 71 is desirably made of metal that has a high etching selectivity with respect to the conductive layer 70 and that allows film deposition in the same chamber as that for the conductive layer 70 in order to ensure a high throughput. From this point of view, Mo and W are preferably used among the above-described transition metals. FIG. 11C illustrates a state of forming the insulating layer 40 in the cavity 44 of the stacked body illustrated in FIG. 11B. FIGS. 11A to 11C respectively correspond to FIGS. 6, 7, and 2. For convenience of explanation, illustrations of structures of the opening OP1, the columnar part CL, etc., are omitted in FIGS. 11A to 11C. The same applies to FIGS. 8A to 10C, which will be described later.

The solid lines shown in each of the sacrificial layers 71 and the conductive layers 70 in FIGS. 11A to 11C schematically represent grain boundaries (grain interfaces) of metal crystals in the corresponding layer. In this manner, in the comparative example, the interlayer film 60 is not provided between the sacrificial layer 71 and the conductive layer 70, unlike the disclosure. According to findings of the applicant, crystal grain sizes tend to gradually increase from the lowermost sacrificial layer 71 to the uppermost conductive layer 70, as illustrated in FIG. 11A.

This is presumed to occur due to facilitation of crystal growth in an upper layer starting from grain boundaries in a lower layer, in the state in which a crystal structure of each of the sacrificial layer 71 and the conductive layer 70 using Mo or W is a three-dimensional crystal structure of a cubic system (body-centered cubic system). The crystalline state of each layer remains in the conductive layer 70 after the insulating layer 40 is formed adjacent thereto, and thus, as illustrated in FIG. 11C, a crystal grain size P2 of a relatively upper conductive layer 70 tends to be larger than a crystal grain size P1 of the relatively lower conductive layer 70. Under these conditions, in the relatively upper conductive layer 70, grain boundaries themselves are reduced, whereby scattering of electrons at crystal interfaces is decreased, and electric resistance tends to be relatively small. Such a difference in electric resistance between the upper conductive layer 70 and the lower conductive layer 70 becomes great as the stacked number of the conductive layers 70 increases, and as a result, operation of the memory cell array 1 may vary. Thus, this phenomenon is a significant issue in highly integrating a semiconductor device.

Modification Example 1

Figure 8A:
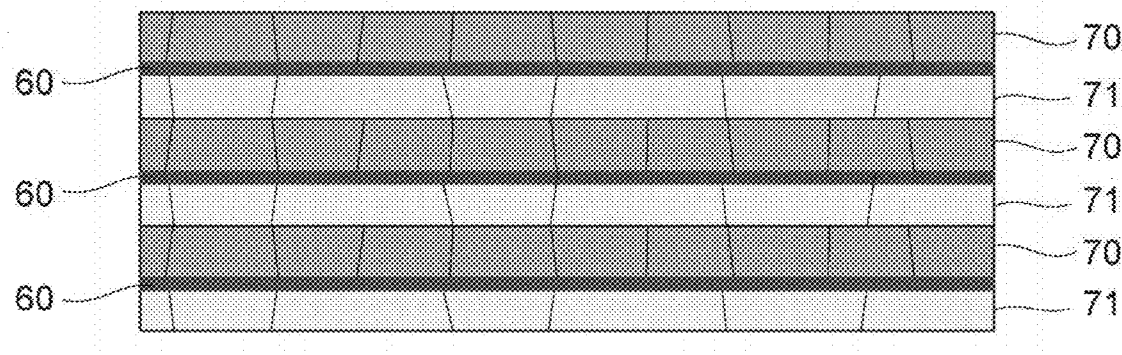
FIGS. 8A to 8C illustrate a process flowchart in an example (modification example 1 or other modification example) of manufacturing the semiconductor device illustrated in FIG. 1.
Figure 8B:
Figure 8B:
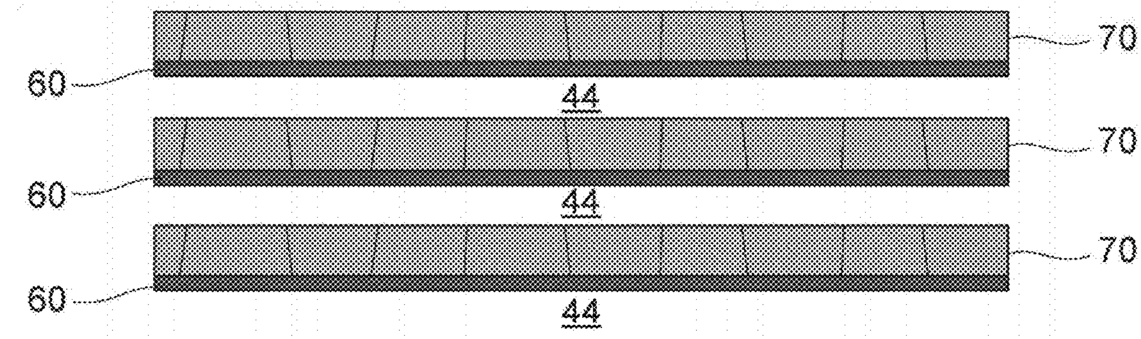
Figure 8C:
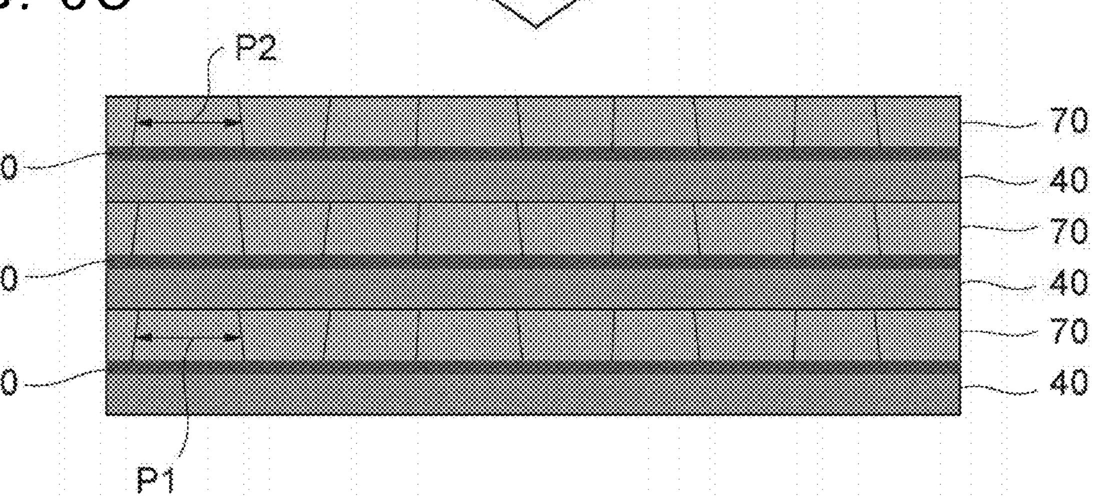

FIGS. 8A to 8C show a process flowchart (sectional views) schematically illustrating states in some steps in manufacturing the stacked body 100 of the memory cell array 1 by a modification example 1 of the method for manufacturing the semiconductor device of the disclosure. This modification example 1 uses the following material as the material for forming each layer illustrated in FIGS. 8A to 8C.

Sacrificial layer 71: Mo
Interlayer film 60: $MoS_2$
Conductive layer 70: W
Insulating layer 40: $SiO_2$ FIG. 8A illustrates a state of alternately stacking the sacrificial layer 71, the interlayer film 60, and the conductive layer 70, in this order from a lower layer to an upper layer. FIG. 8B illustrates a state of removing the sacrificial layers 71 from the stacked body illustrated in FIG. 8A. FIG. 8C illustrates a state of forming insulating layers 40 in cavities 44 of the stacked body illustrated in FIG. 8B.

In this modification example 1, a main element contained in the sacrificial layer 71 and a main element contained in the interlayer film 60 are Mo. These layers may be deposited by, for example, a PVD method. More specifically, the sacrificial layer 71 may be deposited by, for example, non-reactive sputtering using a Mo target and Ar gas, and the conductive layer 70 may be deposited by, for example, non-reactive sputtering using a W target and Ar gas. The interlayer film 60 may be deposited by, for example, reactive sputtering using a Mo target, Ar gas, and gas containing sulfur (S) such as $H_2S$ gas or $CS_2$ gas, or non-reactive sputtering using a $MoS_2$ target and Ar gas. Alternatively, after the sacrificial layer 71 is deposited, or during deposition thereof, gas containing S may be introduced in the same film deposition chamber to sulfurize the surface of the sacrificial layer 71, whereby the interlayer film 60 mainly containing $MoS_2$ may be formed in a continuous manner. In this case, it is preferable to increase temperature of the substrate 10, apply high frequency or the like to generate plasma, or perform other method, for the purpose of acceleration of sulfurization reaction.

In this modification example 1, the crystal structures of the sacrificial layer 71 (Mo) and the conductive layer 70 (W) are three-dimensional crystal structures of a cubic system, whereas the crystal structure of the interlayer film 60 ($MoS_2$) is a two-dimensional crystal structure with hexagonal crystal-based layers. In this manner, the crystal structure differs between each of the sacrificial layer 71 and the conductive layer 70, and the interlayer film 60. This hardly causes crystal growth starting from grain boundaries in the sacrificial layer 71, in the interlayer film 60 formed on the sacrificial layer 71. Thus, in the conductive layer 70 that is further formed on the interlayer film 60, crystal growth starting from grain boundaries in the sacrificial layer 71 hardly continues, and excessive crystal growth in the conductive layer 70, as in the above-described comparative example, is suppressed or prevented (refer to FIG. 8A).

In this manner, the interlayer film 60 provides an effect in such a manner as to once reset crystal growth in the conductive layer 70. As a result, as illustrated in FIG. 8C, a crystal grain size P1 of a relatively lower conductive layer 70 and a crystal grain size P2 of the relatively upper conductive layer 70 are approximately equal to each other. Thus, the degrees of scattering of electrons at crystal interfaces in the conductive layers 70 are approximately the same, whereby occurrence of difference in electric resistance between an upper conductive layer 70 and a lower conductive layer 70 is effectively prevented. This reduces variations in operation of the memory cell array 1, resulting in contribution to high integration of the semiconductor device.

The crystals of the interlayer film 60 form a two-dimensional layer structure and thereby improve flatness of the surface of the interlayer film 60 (reduce roughness). In this state, although roughness of each of the sacrificial layers 71 and the conductive layers 70 accumulates in the multilayer stacked structure, deterioration in flatness of the relatively upper conductive layer 70 is prevented. A two-dimensional layer structure, such as one formed of crystals of the interlayer film 60, has a high film density and thereby does not easily have pinholes even when it is thin, and therefore, it increases barrier characteristics between the conductive layer 70 and the insulating layer 40. This prevents W of the conductive layer 70 from diffusing into the insulating layer 40 via, for example, pinholes, and prevents deterioration in insulation characteristics of the insulating layer 40.

The crystals of the interlayer film 60 ($MoS_2$) form a two-dimensional layer structure, and S—S bonding is weaker than Mo—S bonding, whereby dislocation easily occurs between crystal layers constituting the interlayer film 60. Thus, when film stress occurs in the stacked body 100, dislocation in the interlayer film 60 occurs and relaxes this stress. Moreover, a two-dimensional layer structure, such as of the interlayer film 60, has a high bonding termination at an interface and thereby prevents scattering of electrons at an interface between the conductive layer 70 and the interlayer film 60 as well as scattering of electrons at an interface between the insulating layer 40 and the interlayer film 60, resulting in further reduction in electric resistance of the conductive layer 70. Furthermore, the combination of the sacrificial layer 71 (Mo) and the conductive layer 70 (W) provides a high etching selectivity, and high conductivity of W itself reduces electric resistance of the conductive layer 70 to a sufficiently small degree and contributes to high speed operation of the memory.

In addition, the main elements of both of the sacrificial layer 71 and the interlayer film 60 are Mo, whereby the interlayer film 60 can be easily formed on one surface of the sacrificial layer 71 in a continuous manner after the sacrificial layer 71 is deposited, or during deposition thereof. Thus, it is possible to improve throughput and ease of operation. In consideration of the features of the crystal structure and the function (function of resetting crystal growth) thereof of the interlayer film 60, the interlayer film 60 can be made thinner than each of the conductive layer 70 and the insulating layer 40. This enables reducing the total height of the stacked body 100 and decreasing an etching aspect ratio in penetrating to provide the openings OP1 and OP2, whereby etching for forming each of the openings OP1 and OP2 is easily performed. In addition, this can contribute to improvement in degree of integration of the stacked direction (film thickness direction).

Modification Example 2

Figure 9A:
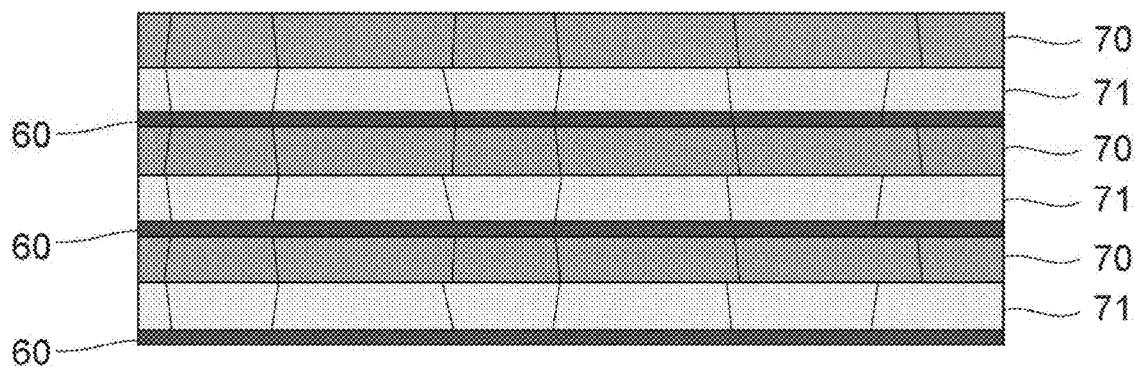
FIGS. 9A to 9C illustrate a process flowchart in an example (modification example 2) of manufacturing the semiconductor device illustrated in FIG. 1.
Figure 9B:
Figure 9B:
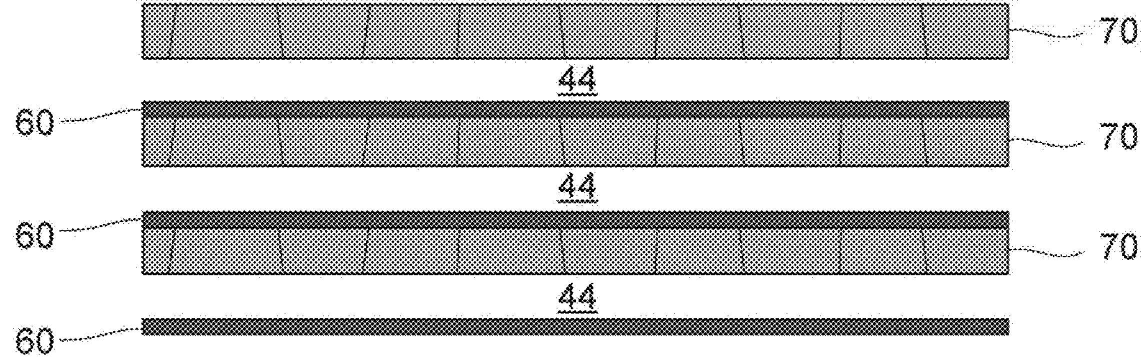
Figure 9C:
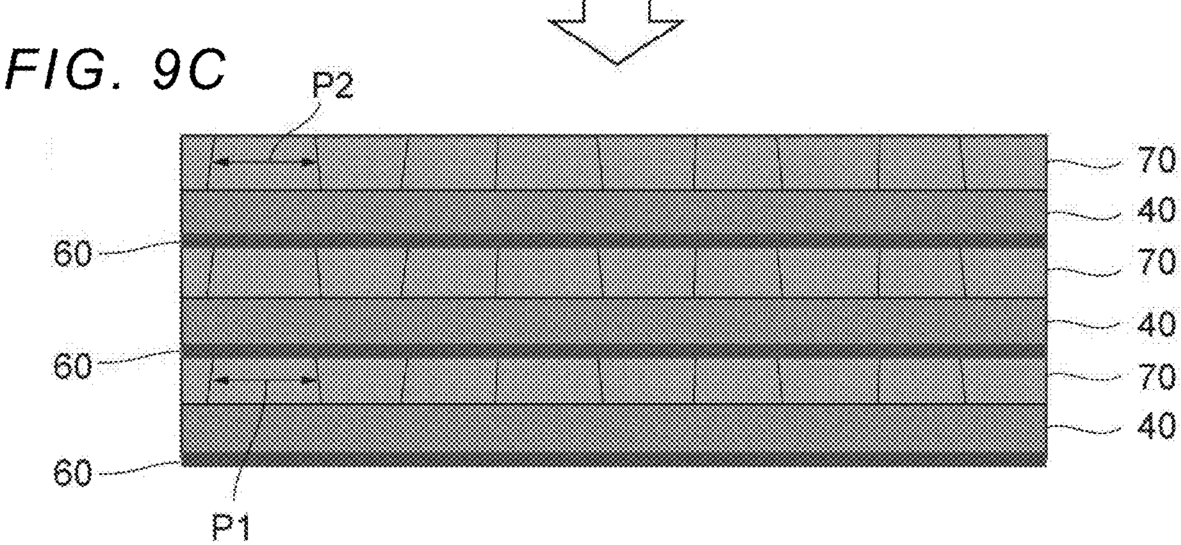

FIGS. 9A to 9C show a process flowchart (sectional views) schematically illustrating states in some steps in manufacturing the stacked body 100 of the memory cell array 1 by a modification example 2 of the method for manufacturing the semiconductor device of the disclosure. This modification example 2 uses the following material as the material for forming each layer illustrated in FIGS. 9A to 9C.

Sacrificial layer 71: Mo
Interlayer film 60: $WS_2$
Conductive layer 70: W
Insulating layer 40: $SiO_2$ FIG. 9A illustrates a state of alternately stacking the sacrificial layer 71, the conductive layer 70, and the interlayer film 60, in this order from a lower layer to an upper layer. FIG. 9B illustrates a state of removing the sacrificial layers 71 from the stacked body illustrated in FIG. 9A. FIG. 9C illustrates a state of forming insulating layers 40 in cavities 44 of the stacked body illustrated in FIG. 9B.

In this modification example 2, a main element contained in the conductive layer 70 and a main element contained in the interlayer film 60 are W. These layers may also be deposited by, for example, a PVD method, as in the modification example 1. More specifically, the sacrificial layer 71 and the conductive layer 70 may be deposited in the same manner as in the modification example 1. The interlayer film 60 may be deposited by, for example, reactive sputtering using a W target, Ar gas, and gas containing S such as $H_2S$ gas or $CS_2$ gas, or non-reactive sputtering using a $WS_2$ target and Ar gas. Alternatively, after the conductive layer 70 is deposited, or during deposition thereof, gas containing S may be introduced in the same film deposition chamber to sulfurize the surface of the conductive layer 70, whereby the interlayer film 60 made of $WS_2$ may be formed in a continuous manner. In this case, it is preferable to increase temperature of the substrate 10, apply high frequency or the like to generate plasma, or perform other method, for the purpose of acceleration of sulfurization reaction.

In this modification example 2, crystal growth starting from grain boundaries in the conductive layer 70 tends to not occur in the interlayer film 60 that is formed on the conductive layer 70. Thus, in the sacrificial layer 71 that is further formed on the interlayer film 60, crystal growth starting from grain boundaries in the conductive layer 70 hardly continues, and excessive crystal growth in the conductive layer 70 that is further formed on the sacrificial layer 71 is also suppressed or prevented (refer to FIG. 9A). As a result, as illustrated in FIG. 9C, the crystal grain size P1 of the relatively lower conductive layer 70 and the crystal grain size P2 of the relatively upper conductive layer 70 are approximately equal to each other. Thus, occurrence of difference in electric resistance between the upper conductive layer 70 and the lower conductive layer 70 is effectively prevented. This reduces variations in operation of the memory cell array 1, resulting in contribution to high integration of the semiconductor device.

The main elements of both of the conductive layer 70 and the interlayer film 60 are W, whereby the interlayer film 60 can be easily formed on one surface of the conductive layer 70 in a continuous manner after the conductive layer 70 is deposited, or during deposition thereof. Thus, it is possible to improve throughput and ease of operation. In addition, also in the modification example 2, the function of the interlayer film 60 provides other functions and effects that are equivalent to those obtained in the modification example 1. In order to avoid redundant description, detailed explanation is omitted herein. Hereinafter, the same applies to other modification examples.

Modification Example 3

The modification example 3 uses the following material, as in the modification example 2, as the material for forming each layer illustrated in FIGS. 8A to 8C in the modification example 1.

Sacrificial layer 71: Mo
Interlayer film 60: $WS_2$
Conductive layer 70: W
Insulating layer 40: $SiO_2$ FIG. 8A corresponds also to this modification example 3 and illustrates a state of alternately stacking the sacrificial layer 71, the interlayer film 60, and the conductive layer 70, in this order from a lower layer to an upper layer, as in the modification example 1. FIGS. 8B and 8C correspond to the modification example 3 and illustrate states similar to those in the modification example 1.

Also in this modification example 3, a main element contained in the conductive layer 70 and a main element contained in the interlayer film 60 are W. These layers can also be deposited by, for example, a PVD method, as in the modification example 1. More specifically, the sacrificial layer 71 and the conductive layer 70 may be deposited in the same manner as in the modification example 1. As in the modification example 2, the interlayer film 60 may be deposited by, for example, reactive sputtering using a W target, Ar gas, and gas containing S such as $H_2S$ gas or $CS_2$ gas, or non-reactive sputtering using a $WS_2$ target and Ar gas. In this case, it is preferable to increase temperature of the substrate 10, apply high frequency or the like to generate plasma, or perform other method, for the purpose of acceleration of sulfurization reaction. After the interlayer film 60 is deposited, or during deposition thereof, introduction of gas containing S to the same film deposition chamber may be stopped, and the conductive layer 70 may be continuously formed by non-reactive sputtering using a W target and Ar gas.

In this modification example 3, as in the modification example 1, crystal growth starting from grain boundaries in the sacrificial layer 71 tends to not occur in the interlayer film 60 that is formed on the sacrificial layer 71. Thus, in the conductive layer 70 that is further formed on the interlayer film 60, crystal growth starting from grain boundaries in the sacrificial layer 71 hardly continues, and excessive crystal growth therein is also suppressed or prevented (refer to FIG. 8A). As a result, as illustrated in FIG. 8C, the crystal grain size P1 of the relatively lower conductive layer 70 and the crystal grain size P2 of the relatively upper conductive layer 70 are approximately equal to each other. Thus, occurrence of difference in electric resistance between the upper conductive layer 70 and the lower conductive layer 70 is effectively prevented. This reduces variations in operation of the memory cell array 1, resulting in contribution to high integration of the semiconductor device.

Modification Example 4

The modification example 4 uses the following material as the material for forming each layer illustrated in FIGS. 8A to 8C in the modification example 1.

Sacrificial layer 71: W
Interlayer film 60: $WS_2$
Conductive layer 70: Mo
Insulating layer 40: $SiO_2$ FIG. 8A corresponds also to this modification example 4 and illustrates a state of alternately stacking the sacrificial layer 71, the interlayer film 60, and the conductive layer 70, in this order from a lower layer to an upper layer, as in the modification example 1. FIGS. 8B and 8C also correspond to the modification example 4 and illustrate states similar to those in the modification example 1.

In this modification example 4, a main element contained in the sacrificial layer 71 and a main element contained in the interlayer film 60 are W. These layers can also be deposited by, for example, a PVD method, as in the modification example 1. More specifically, the sacrificial layer 71 and the conductive layer 70 may be deposited in the same manner as in the modification example 1. The interlayer film 60 may be deposited by, for example, reactive sputtering using a W target, Ar gas, and gas containing S such as $H_2S$ gas or $CS_2$ gas, or non-reactive sputtering using a $WS_2$ target and Ar gas. Alternatively, after the sacrificial layer 71 is deposited, or during deposition thereof, gas containing S may be introduced in the same film deposition chamber to sulfurize the surface of the sacrificial layer 71, whereby the interlayer film 60 made of $WS_2$ may be formed in a continuous manner. In this case, it is preferable to increase temperature of the substrate 10, apply high frequency or the like to generate plasma, or perform other method, for the purpose of acceleration of sulfurization reaction.

In this modification example 4, as in the modification example 1, crystal growth starting from grain boundaries in the sacrificial layer 71 tends to not occur in the interlayer film 60 that is formed on the sacrificial layer 71. Thus, in the conductive layer 70 that is further formed on the interlayer film 60, crystal growth starting from grain boundaries in the sacrificial layer 71 hardly continues, and excessive crystal growth therein is also suppressed or prevented (refer to FIG. 8A). As a result, as illustrated in FIG. 8C, the crystal grain size P1 of the relatively lower conductive layer 70 and the crystal grain size P2 of the relatively upper conductive layer 70 are approximately equal to each other. Thus, occurrence of difference in electric resistance between the upper conductive layer 70 and the lower conductive layer 70 is effectively prevented. This reduces variations in operation of the memory cell array 1, resulting in contribution to high integration of the semiconductor device.

Modification Example 5

Figure 10A:
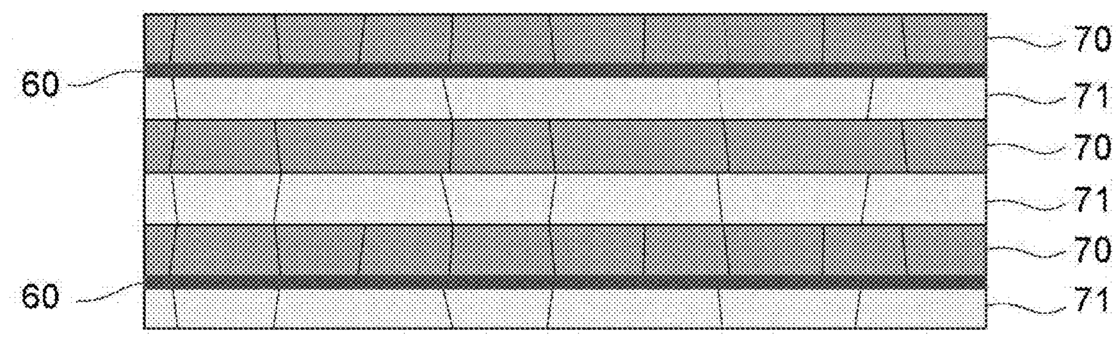
FIGS. 10A to 10C illustrate a process flowchart in an example (modification example 5) of manufacturing the semiconductor device illustrated in FIG. 1.
Figure 10A:
Figure 10B:
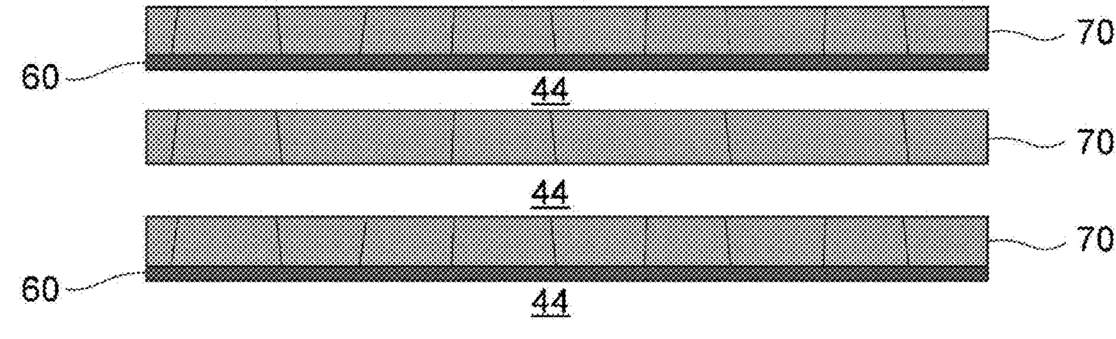
Figure 10B:
Figure 10C:
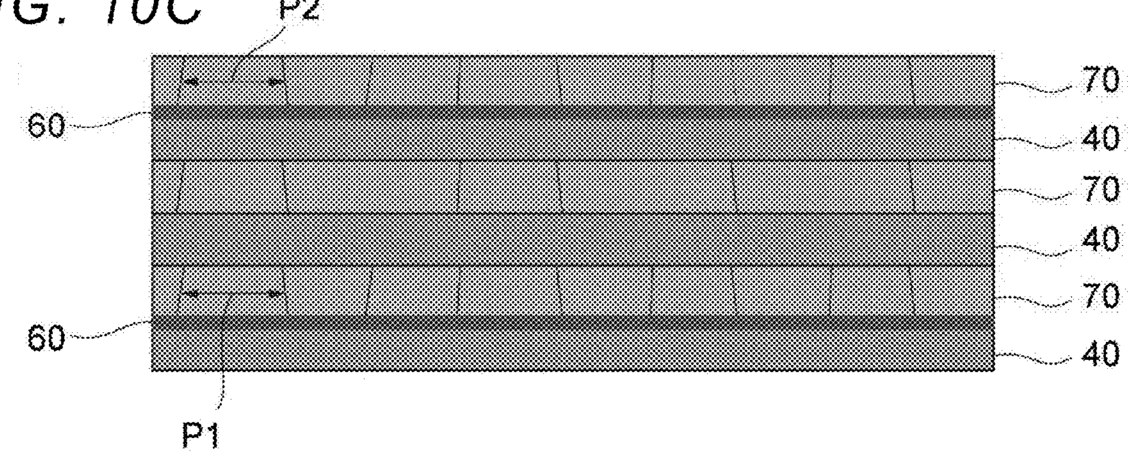

FIGS. 10A to 10C show a process flowchart (sectional views) schematically illustrating states in some steps in manufacturing the stacked body 100 of the memory cell array 1 by a modification example 5 of the method for manufacturing the semiconductor device of the disclosure. This modification example 5 uses the following material, as in the comparative example 1, as the material for forming each layer illustrated in FIGS. 10A to 10C, and it employs the same manufacturing method as in the modification example 1, except that one interlayer film 60 is formed per two pairs of the conductive layers 70 and the insulating layers 40 in the stacked structure.

Sacrificial layer 71: Mo
Interlayer film 60: $MoS_2$
Conductive layer 70: W
Insulating layer 40: $SiO_2$ In this modification example 5, in addition to the functions and the effects of the modification example 1 and so on, the number of formed interlayer films 60 for preventing excessive crystal growth in the conductive layers 70 can be decreased when the degree of crystal growth in stacking the conductive layer 70 is relatively small. Decreasing the number of formed interlayer films 60 in this manner reduces the total height of the stacked body 100 and decreases an etching aspect ratio in penetrating to provide the openings OP1 and OP2, which makes it easy to perform etching for forming each of the openings OP1 and OP2. In addition, this provides an effect of improving the degree of integration of the stacked direction (film thickness direction).

Structural Example 2 of Memory Cell Array

For the structural example 1 of the memory cell array and the modification examples 1 to 5, examples in which the interlayer film 60 deposited in the manufacturing process is interposed between the conductive layer 70 and the insulating layer 40 are described. However, in such a case in which the interlayer film 60 has a very thin thickness, the crystal structure of the interlayer film 60 may not be maintained due to a subsequent heat treatment or the like, and a boundary between the interlayer film 60 and each of the conductive layer 70 and the insulating layer 40 may not be clearly observed. Even in such a case, the constituent components (elements) of the interlayer film 60 diffuse and move toward the conductive layer 70 and the insulating layer 40, and they are contained in boundary parts (boundary areas) between the interlayer film 60 and each of the conductive layer 70 and the insulating layer 40. Thus, the structural example 2 of the memory cell array of the disclosure includes the following structure of a memory cell array. That is, this memory cell array includes a plurality of insulating layers 40, a plurality of conductive layers 70 that are formed alternately with the plurality of insulating layers 40, and channels (parts of columnar parts CL) penetrating through the plurality of conductive layers 70 and the plurality of insulating layers although interlayer films 60 cannot be clearly distinguished. The insulating layers 40 and the conductive layers 70 have parts containing chalcogen elements (S, Se, or Te).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure. The embodiments described above can be partially replaced, partially removed, or partially combined with each other. For example, an appropriate insulating layer may be provided between the substrate 10 and the source layer SL. On the condition that the conductive layers 70 adjacent in the stacked direction are mutually insulated, the adjacent conductive layers 70 may have an air gap therebetween. That is, a layer of such an air gap also corresponds to the "insulating layer" of the disclosure.

Moreover, the insulating layer 40 may not be formed in the opening OP1, and a circular tubular insulating layer 40 may be formed in the opening OP1. In this case, a conductive layer that also functions as wiring may be formed in a circular tubular hollow part of the opening OP1. In addition, the interlayer film 60 in the modification example 5 may be formed per three or greater pairs of the conductive layers 70 and the insulating layers 40 in the stacked structure, and a plurality of cycles of forming the interlayer film 60 may be used together. Furthermore, in the case of continuously forming the sacrificial layer 71 and the interlayer film 60 in the same chamber, the forming order is not limited, and also in the case of continuously forming the conductive layer 70 and the interlayer film 60 in the same chamber, the forming order is not limited.

What is claimed is:

1. A semiconductor device comprising:
- a plurality of insulating layers;
- a plurality of conductive layers that are disposed alternately with the plurality of insulating layers;
- an interlayer film being different from the plurality of conductive layers, the interlayer film having a crystal structure of a hexagonal crystal system, and being disposed between at least one of the insulating layers and at least one of the conductive layers; and
- a channel penetrating through the plurality of conductive layers, the interlayer film, and the plurality of insulating layers;
- wherein the plurality of conductive layers include a first conductive layer and a second conductive layer provided above the first conductive layer, a crystal grain size of the first conductive layer is equal to a crystal grain size of the second conductive layer.

2. The semiconductor device according to claim 1, wherein the conductive layers have a crystal structure of a cubic system.

3. The semiconductor device according to claim 1, wherein the conductive layers have a three-dimensional crystal structure, and
- the interlayer film has a two-dimensional crystal structure.

4. The semiconductor device according to claim 3, wherein the two-dimensional crystal includes a hexagonal crystal-based layer.

5. The semiconductor device according to claim 1, wherein the conductive layers contain a transition element or carbon, and
- the interlayer film contains a transition element of dichalcogenide or graphene.

6. The semiconductor device according to claim 1, wherein the conductive layers contain at least one of W, Mo, Ti, or Nb, and
- the interlayer film contains at least one of $WS_2$, $MoS_2$, $TiS_2$, $NbS_2$, or C.

7. The semiconductor device according to claim 6, wherein the interlayer film contains at least one of $WS_2$, $MoS_2$, $TiS_2$, or $NbS_2$.

8. The semiconductor device according to claim 1, wherein the interlayer film is thinner than each of the conductive layers and the insulating layer.

9. The semiconductor device according to claim 1, wherein the semiconductor device includes a NAND memory.

10. The semiconductor device according to claim 1, wherein the insulating layers are formed of an inorganic oxide or an inorganic nitride.

11. The semiconductor device according to claim 1, wherein the conductive layers are formed of a single-metal body.

12. The semiconductor device according to claim 1, wherein the conductive layers are formed of a transition metal.

13. The semiconductor device according to claim 1, wherein the channel includes a semiconductor layer.

14. The semiconductor device according to claim 1, wherein the interlayer film is not provided between the conductive layers and the channel in a first direction crossing to a stacking direction of the insulating layers and the conductive layers.

15. A semiconductor device comprising:

a plurality of insulating layers;

a plurality of conductive layers that are disposed alternately with the plurality of insulating layers;

a channel penetrating through the plurality of conductive layers and the plurality of insulating layers; and a region containing at least one of S, Se, or Te, at a boundary area between at least one of the conductive layers and at least one of the insulating layers.

16. The semiconductor device according to claim 15, wherein the plurality of insulating layers includes a first conductive layer and a second conductive layer provided above the first conductive layer, a crystal grain size of the first conductive layer is equal to a crystal grain size of the second conductive layer.

17. The semiconductor device according to claim 16, wherein the region contains at least one of $WS_2$, $MoS_2$, $TiS_2$, or $NbS_2$.

18. A semiconductor device comprising:

a plurality of insulating layers;

a plurality of conductive layers that are disposed alternately with the plurality of insulating layers;

an interlayer film being different from the plurality of conductive layers, the interlayer film having a crystal structure of a hexagonal crystal system, and being disposed between at least one of the insulating layers and at least one of the conductive layers; and a channel penetrating through the plurality of conductive layers, the interlayer film, and the plurality of insulating layers, wherein the conductive layers contain a transition element, and the interlayer film contains a transition element of dichalcogenide.

19. The semiconductor device according to claim 18, wherein the interlayer film contains at least one of $WS_2$, $MoS_2$, $TiS_2$, or $NbS_2$.

20. The semiconductor device according to claim 18, wherein the plurality of insulating layers includes a first conductive layer and a second conductive layer provided above the first conductive layer, a crystal grain size of the first conductive layer is equal to a crystal grain size of the second conductive layer.

* * * * *